United States Patent
Park et al.

(10) Patent No.: US 7,973,341 B2
(45) Date of Patent: Jul. 5, 2011

(54) FUSE OF SEMICONDUCTOR DEVICE

(75) Inventors: Hyung Jin Park, Gyeonggi-do (KR); Won Ho Shin, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/729,959

(22) Filed: Mar. 23, 2010

(65) Prior Publication Data

US 2010/0176911 A1    Jul. 15, 2010

Related U.S. Application Data

(62) Division of application No. 12/117,423, filed on May 8, 2008, now Pat. No. 7,713,793.

(30) Foreign Application Priority Data

Dec. 26, 2007 (KR) .......... 10-2007-0137981

(51) Int. Cl.
*H01L 23/52* (2006.01)

(52) U.S. Cl. ............ 257/209; 257/211; 257/E21.592; 438/128; 438/132

(58) Field of Classification Search ............. 257/209, 257/211, E21.592; 438/128, 132
See application file for complete search history.

(56) References Cited

U.S. PATENT DOCUMENTS

| RE36,644 E | 4/2000 | Dennison |
| 6,444,544 B1 | 9/2002 | Hu et al. |
| 7,186,593 B2 * | 3/2007 | Kim ............... 438/132 |
| 2004/0262768 A1 | 12/2004 | Cho et al. |
| 2007/0172995 A1 | 7/2007 | Choi |

FOREIGN PATENT DOCUMENTS

| JP | 07-078872 A | 3/1995 |
| KR | 1020000077334 | 12/2000 |
| KR | 10-0871389 | 12/2008 |

* cited by examiner

*Primary Examiner* — Zandra Smith
*Assistant Examiner* — Christy L Novacek
(74) *Attorney, Agent, or Firm* — Marshall, Gerstein & Borun LLP

(57) ABSTRACT

A method for manufacturing a fuse of a semiconductor device comprises forming an island-type metal fuse in a region where a laser is irradiated, so that laser energy may not be dispersed in a fuse blowing process, thereby improving repair efficiency.

9 Claims, 5 Drawing Sheets

FUSE OF SEMICONDUCTOR DEVICE

CROSS-REFERENCE TO RELATED APPLICATION

This is a division of U.S. application Ser. No. 12/117,423 filed, May 8, 2008, which claims the priority benefit under 35 USC 119 of Korean patent application number 10-2007-137981, filed on Dec. 26, 2007, the disclosure of which is incorporated by reference in its entirety, is claimed.

BACKGROUND OF THE INVENTION

The invention relates generally to a fuse of a semiconductor device and a method for manufacturing the same and, more specifically, to technology for forming an island-type metal fuse in a region where a laser is irradiated so that laser energy may not be dispersed in a fuse blowing process, thereby improving repair efficiency.

In manufacturing semiconductor devices, if even a single fine cell of the device has a defect, the device does not serve as a memory, and is treated as a defective device.

However, it is inefficient to disuse the device as defective when a cell of the memory has a defect.

In some cases, a redundancy cell which is previously installed in the memory device is replaced with a defective cell to repair the entire memory, thereby improving yield.

The repair method using a redundancy cell includes replacing a normal word line having a defect or a normal bit line having a defect with a redundancy word line or a redundancy bit line which is disposed in each cell array.

When a defective cell is found through a test after processing a wafer, an internal circuit performs a program to replace an address corresponding to the defective cell with an address of a redundancy cell. As a result, in use an address signal corresponding to the defective cell is inputted to access data of the redundancy cell, which is replaced corresponding to the defective cell.

Generally, the program system includes burning and blowing a fuse with a laser beam to replace a path of an address. As a result, a common memory device includes a fuse unit configured to replace an address path by irradiating and blowing (opening) a fuse with a laser. A "fuse" refers to a line cut by irradiation of laser, and a "fuse box" refers to the cut site and its surrounding region.

The fuse unit has a plurality of fuse sets. One fuse set can replace an address path. The number of fuse sets in the fuse box corresponds to the number of redundancy word lines or redundancy bit lines in the memory device.

In general, a method for fabricating a semiconductor device includes forming and planarizing an interlayer insulating film over a fuse region of a semiconductor substrate, forming a plurality of fuses over the interlayer insulating film, and forming an insulating film over the semiconductor substrate to cover the fuses.

A partial thickness of the insulating film is etched to form a fuse open region so that the insulating film having a given thickness may remain on the fuse of a local blowing region. The fuse open region is then irradiated with laser, and a blowing process is performed to cut a given metal fuse.

The remaining insulating film generally has a thickness ranging from 1000 Å to 3000 Å over the fuse. However, laser energy is not absorbed in the insulating film but passed through the insulating film because the insulating film has a transparent property such as glass. As a result, most laser energy is absorbed by the fuse. The fuse is thermally expanded by the laser energy, and the insulating film surrounding the fuse is broken when the thermal expansion reaches a critical point. As a result, most of the residual fuse is vaporized.

The fuse is not formed by an additional process but by using an electrically conductive layer including a bit line, a word line, or a plate line of a capacitor. As the device is highly-integrated in 60 nm, a fuse is formed using a metal line formed on the plate line.

When the fuse is formed with a metal line, the fuse typically has a resistance smaller than that of the plate line by ten times, with excellent thermal conductivity. However, the excellent thermal conductivity disperses laser energy in the blowing process, so that the fuse may not be cut.

BRIEF SUMMARY OF THE INVENTION

Various embodiments of the invention are directed at providing a method for manufacturing a fuse of a semiconductor device that comprises forming an island-type metal fuse in a region where a laser is irradiated so that laser energy may not be dispersed in a fuse blowing process, thereby improving repair efficiency.

Various embodiments of the invention are directed at reducing a fuse area of a region where a laser is irradiated to decrease the amount of laser energy required in fuse cutting, thereby improving efficiency and productivity.

Various embodiments of the invention are directed at reducing cost without additional equipment for cutting a metal fuse.

Various embodiments of the invention are directed at electrically connecting a metal fuse separated from an island-type metal fuse through a concave-shaped conductive film to disrupt transmission of lost laser energy in a horizontal direction.

According to an embodiment of the invention, a method for manufacturing a fuse of a semiconductor device comprises forming a blowing fuse portion and a non-blowing fuse portion horizontally spaced from and aligned with each other at the same level, and forming an electrically conductive connecting portion connecting the blowing fuse portion to the non-blowing fuse portion, wherein the electrically conductive connecting portion is formed at a lower level than the level of the blowing and non-blowing fuse portions.

The electrically conductive connecting portion is preferably formed by forming an etch-stop pattern over a semiconductor substrate; forming an insulating film over the semiconductor substrate and on the etch-stop pattern; etching the insulating film to form a contact hole that exposes the etch-stop pattern; depositing an electrically conductive layer on the insulating film and in the contact hole; and etching an overall surface of the electrically conductive layer until the insulating film is exposed.

The etch-stop pattern preferably comprises a polysilicon layer. The insulating film preferably comprises an oxide layer. The insulating film preferably has a thickness ranging from 21000 Å to 23000 Å. The electrically conductive layer preferably comprises a tungsten layer, and is preferably deposited with a thickness ranging from 2100 Å to 2300 Å. The electrically conductive layer resulting from the etching process is preferably formed at a bottom portion and sidewalls of the contact hole. The electrically conductive layer preferably remains in the contact hole with a thickness ranging from 900 Å to 1100 Å after the etching process.

The blowing fuse portion and the non-blowing fuse portion are preferably formed by forming a metal line on the conductive layer and the insulating film, and selectively etching the metal line until the electrically conductive layer is exposed.

The metal line preferably comprises an aluminum layer. The metal line preferably has a thickness ranging from 3900 Å to 4100 Å.

According to an embodiment of the invention, a fuse of a semiconductor device comprises: a blowing fuse portion; a non-blowing fuse portion horizonally spaced from and aligned with the blowing fuse portion, wherein the blowing portion and the non-blowing portion are arranged at the same level; and an electrically conductive connecting portion, located at a lower level than the blowing and non-blowing fuse portions and connecting the blowing fuse portion to the non-blowing fuse portion. The electrically conductive connecting portion preferably has a concave shape.

DESCRIPTION OF EMBODIMENTS

Figure 1:
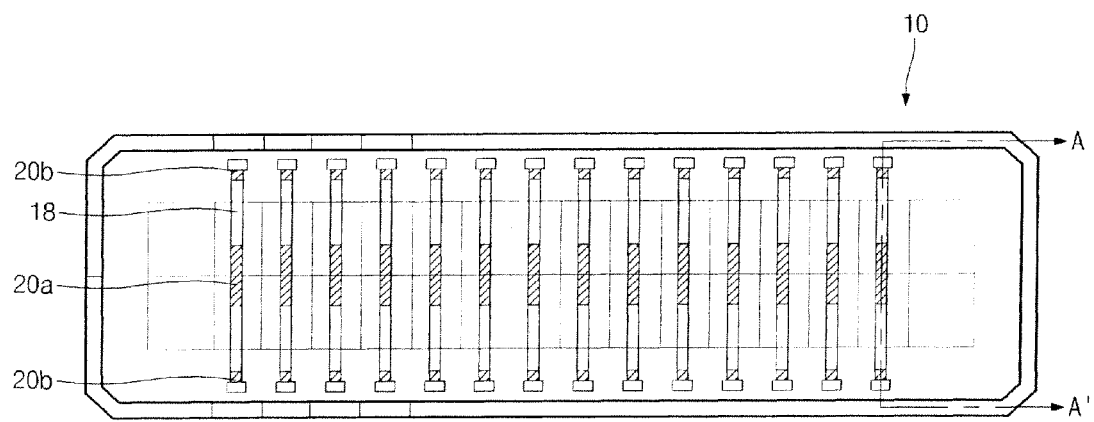
FIG. 1 is a plan view illustrating a fuse of a semiconductor device according to an embodiment of the invention.

FIG. 1 is a plan view illustrating a fuse of a semiconductor device according to an embodiment of the invention.

Referring to FIG. 1, a fuse 20a is formed in a blowing region of a semiconductor substrate 10. A fuse 20b is separated from the fuse 20a in a major-axis direction of the fuse 20a and formed in a non-blowing region. The fuse 20a is electrically connected to 20b through an electrically conductive film 18 which is a connecting portion. The conductive film 18 illustratively and preferably has a concave shape. For example, the concave shaped is "U".

FIGS. 2a to 2f are cross-sectional diagrams illustrating a method for manufacturing a fuse of a semiconductor device according to an embodiment of the invention, taken along A-A' of FIG. 1.

Figure 2A:
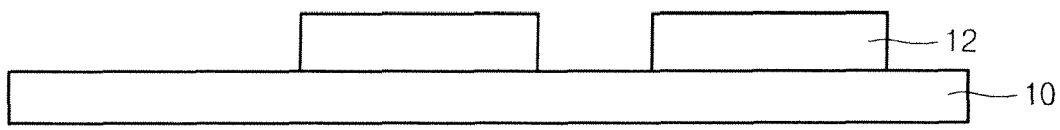
FIGS. 2a to 2f are cross-sectional views illustrating a method for manufacturing a fuse of a semiconductor device according to an embodiment of the invention.

Referring to FIG. 2a, an etch-stop film (not shown) and a first barrier metal layer (not shown) are formed over a semiconductor substrate 10 of the fuse region. The process for forming the etch-stop film is illustratively performed with a process for forming a plate electrode layer of a cell region. The etch-stop pattern preferably comprises a polysilicon layer. The first barrier metal layer preferably comprises a titanium nitride (TiN) film.

The first barrier metal layer and the etch-stop film are selectively etched to form a first barrier metal pattern (not shown) and an etch-stop pattern 12 that expose the semiconductor substrate 10 of the blowing region.

Figure 2B:
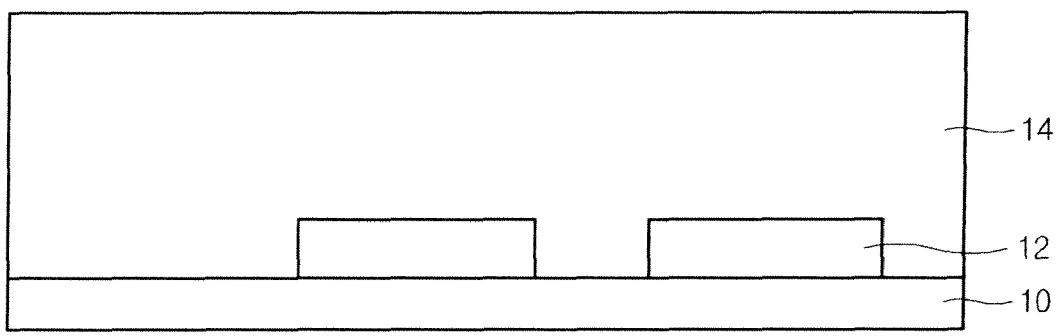

Referring to FIG. 2b, a planarized insulating film 14 is formed over the semiconductor substrate 10, the first barrier metal pattern, and the etch-stop pattern 12. The insulating film 14 preferably comprises an oxide film and preferably has a thickness ranging from 21000 Å to 23000 Å.

Figure 2C:
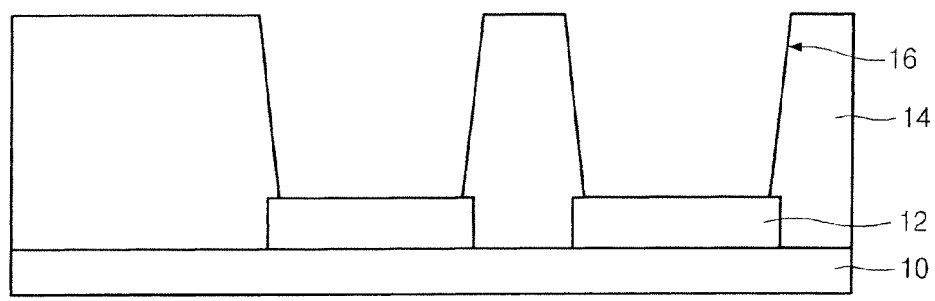

Referring to FIG. 2c, the insulating film 14 is selectively etched to form a contact hole 16 that exposes the etch-stop pattern 12.

Figure 2D:
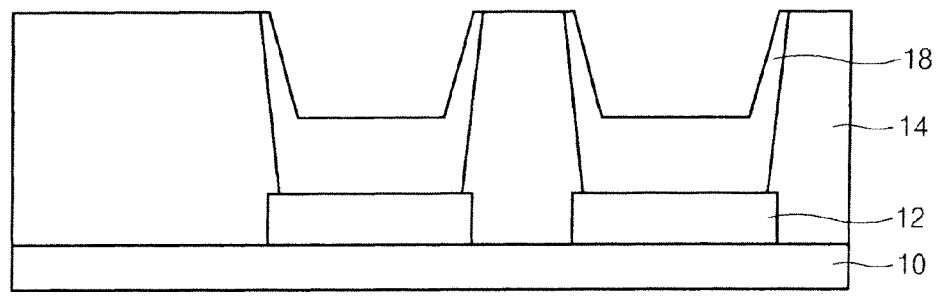

Referring to FIG. 2d, a second barrier metal layer (not shown) and an electrically conductive film 18 are formed over the insulating film 14 including the contact hole 16. The second barrier metal layer preferably comprises a titanium (Ti) film, preferably having a thickness ranging from 45 Å to 55 Å. The electrically conductive film 18 preferably comprises a tungsten (W) film, preferably having a thickness ranging from 2100 Å to 2300 Å.

The conductive film 18 is blanket-etched to expose the insulating film 14. The blanket-etching process of the electrically conductive film 18 is preferably performed by an etch-back method. The electrically conductive film 18 is formed at a bottom portion and sidewalls of the contact hole 16. The electrically conductive film 18 remains in the bottom portion of the contact hole 16 and preferably has a thickness ranging from 900 Å to 1100 Å.

Figure 2E:
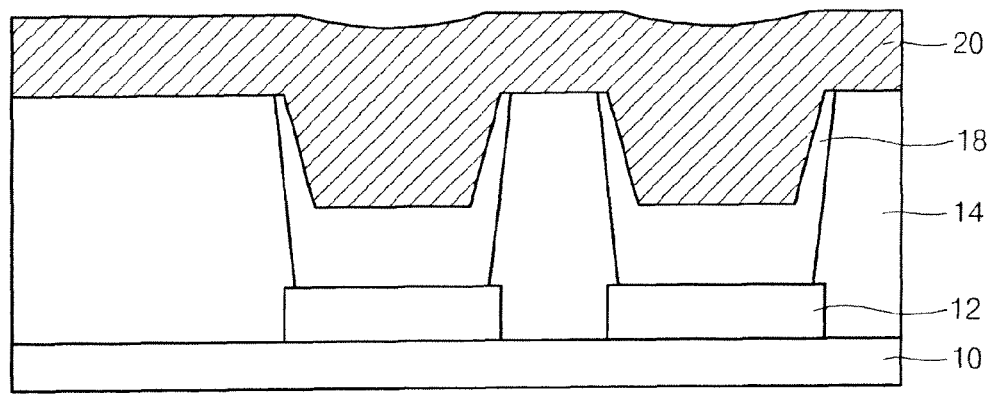

Referring to FIG. 2e, a third barrier metal layer (not shown), a fuse material film 20, and a fourth barrier metal layer (not shown) are formed over the resulting structure. The third barrier metal layer preferably has a deposition structure including a Ti film, preferably having a thickness ranging from 95 Å to 105 Å and a TiN film, preferably having a thickness ranging from 190 Å to 210 Å.

The fuse material film 20 includes a metal line material (Al, for example) preferably having a thickness ranging from 3900 Å to 4100 Å. The fourth barrier metal layer preferably has a deposition structure including a Ti film, preferably having a thickness ranging from 90 Å to 110 Å and a TiN film, preferably having a thickness ranging from 760 Å to 840 Å.

Figure 2F:
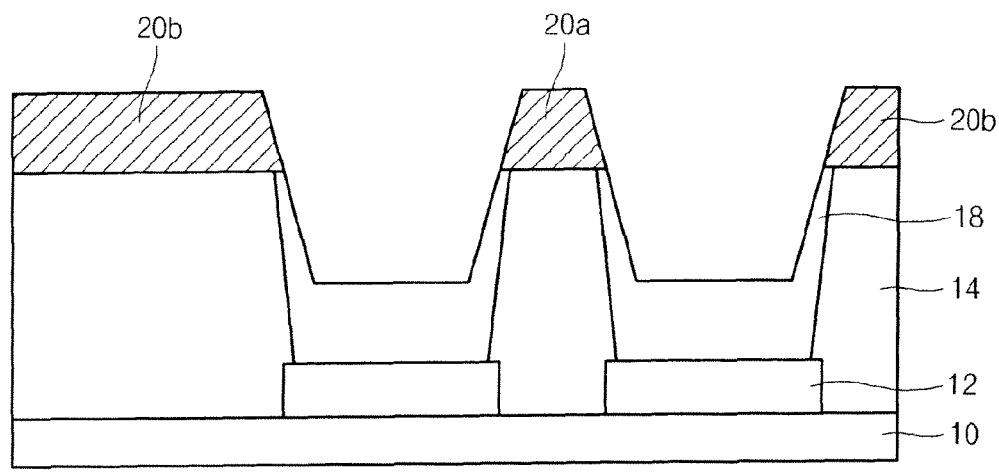

Referring to FIG. 2f, the fuse material film 20 is selectively etched to expose the conductive film 18. The fuses 20a and 20b are formed over the insulating film 14 of the blowing region and the insulating film 14 of the non-blowing region. That is, the fuses include the blowing region 20a and the non-blowing region 20b, which are electrically connected through the electrically conductive film 18.

Figure 3:
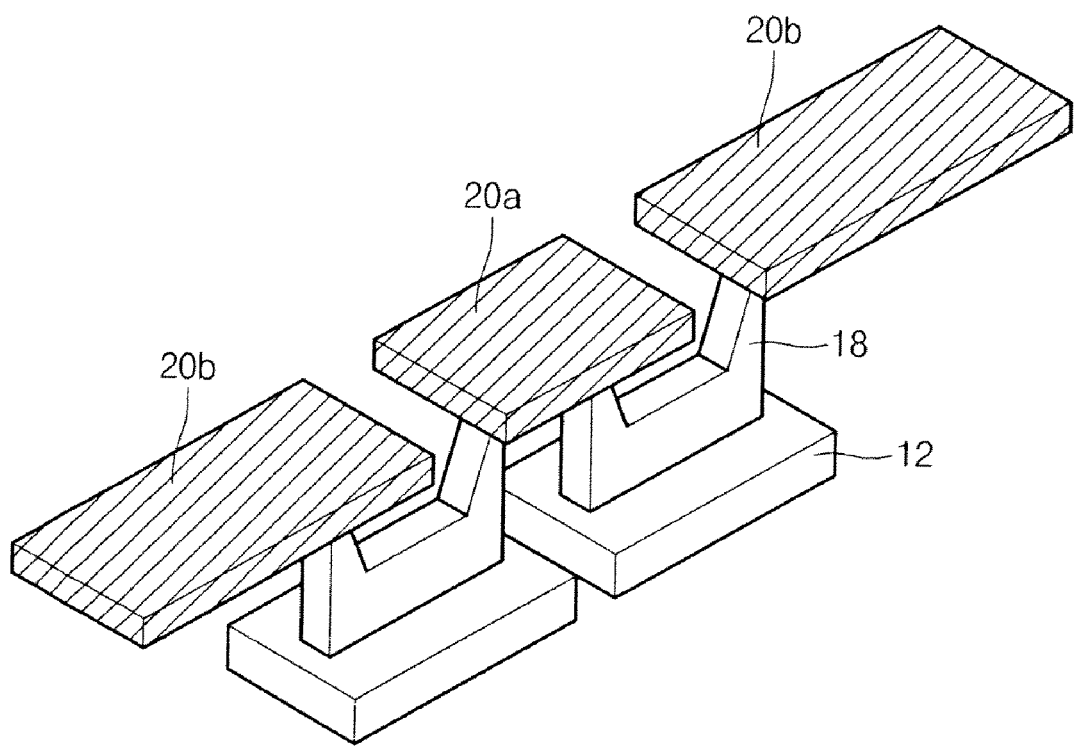
FIG. 3 is a perspective view illustrating a product of the method for manufacturing a fuse of a semiconductor device according to an embodiment of the invention.

FIG. 3 is a diagram illustrating a product of the method for manufacturing a fuse of a semiconductor device according to an embodiment of the invention.

Referring to FIG. 3, the fuse 20a of the blowing region is formed to have an island type, thereby reducing an area where a laser is irradiated in the blowing process. As a result, loss of laser energy is prevented, and the fuse 20a can be cut with small laser energy. Although a partial laser energy may be lost by the electrically conductive film 18, the electrically conductive film 18 is illustratively formed in a concave shape to minimize loss of the laser energy.

The fuse 20a is separated from the fuse 20b, so that the laser energy absorbed by the fuse 20a during the blowing process may be prevented from being transmitted into the fuse 20b. The insulating film 14 is formed between the fuses 20a and the 20b, so that the laser energy may be transmitted through the electrically conductive film 18, thereby preventing vertical loss of the laser energy.

The fuse 20a has a resistance smaller than that of a plate fuse and larger than that of a metal fuse. The fuse 20a has thermal consumption smaller than that of the metal fuse and the plate fuse. As a result, the loss of the laser energy condensed in the fuse 20a during the blowing process is minimized, so that it is easy to cut the fuse.

As described above, according to an embodiment of the invention, a method for manufacturing a fuse of a semiconductor device comprises forming an island-type metal fuse in a region where a laser is irradiated so that a laser energy may not be dispersed in a blowing process, thereby improving repair efficiency.

The method reduces a fuse area of a region where a laser is irradiated to decrease a laser energy required in fuse cutting, thereby improving efficiency and productivity.

The method reduces cost without additional equipment for cutting a metal fuse.

The method includes electrically connecting a metal fuse separated from an island-type metal fuse through a preferably concave-shaped conductive film to disconnect a laser energy that is lost in a horizontal direction.

The above embodiments of the invention are illustrative and not limiting. Various alternatives and equivalents are possible. The invention is not limited by the type of deposition, etching, polishing, and patterning steps described herein, nor is the invention limited to any specific type of semiconductor device. For example, the invention may be implemented in a dynamic random access memory (DRAM) device or non volatile memory device. Other additions, subtractions, or modifications are obvious in view of the disclosure and are intended to fall within the scope of the appended claims.

What is claimed is:

1. A fuse of a semiconductor device comprising:
   a blowing fuse portion;
   a non-blowing fuse portion horizontally spaced from and aligned with the blowing fuse portion,
   wherein the blowing fuse portion and the non-blowing fuse portion are arranged at the same level;
   a contact hole extending from a bottom of the blowing fuse portion to a bottom of the non-blowing fuse portion and disposed between the blowing fuse portion and the non-blowing fuse portion; and
   an electrically conductive connecting portion located at the contact hole, which is at a lower level than the blowing and non-blowing fuse portions and connecting the blowing fuse portion to the non-blowing fuse portion.

2. The fuse according to claim 1, wherein the electrically conductive connecting portion is located at a bottom portion and sidewalls of the contact hole which is formed between the blowing fuse portion and the non-blowing fuse portion.

3. The fuse according to claim 2, wherein the electrically conductive layer has a thickness in the range of 2100 Å to 2300 Å.

4. The fuse according to claim 1, wherein the electrically conductive connecting portion has a concave shape.

5. The fuse according to claim 1, wherein the electrically conductive connecting portion is formed at a bottom portion and sidewalls of the contact hole between the blowing fuse portion and the non-blowing fuse portion.

6. The fuse according to claim 1, further comprising an etch-stop pattern formed under the electrically conductive connecting pattern.

7. The fuse according to claim 6, wherein the etch-stop pattern comprises a polysilicon layer.

8. The fuse according to claim 1, wherein the electrically conductive layer comprises a tungsten layer.

9. The fuse according to claim 1, wherein the blowing fuse portion and the non-blowing fuse portion comprises an aluminum layer.

\* \* \* \* \*